US010452792B1

(12) United States Patent
Flaherty et al.

(10) Patent No.: US 10,452,792 B1
(45) Date of Patent: Oct. 22, 2019

(54) SIMULATING DEMAND AND LOAD ON STORAGE SERVERS

(71) Applicant: Amazon Technologies, Inc., Seattle, WA (US)

(72) Inventors: Mitchell Gannon Flaherty, Seattle, WA (US); Christopher Magee Greenwood, Seattle, WA (US); Gary Michael Herndon, Jr., Seattle, WA (US); Surya Prakash Dhoolam, Seattle, WA (US); Haoyu Huang, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 417 days.

(21) Appl. No.: 15/084,248

(22) Filed: Mar. 29, 2016

(51) Int. Cl.
*G06F 17/50* (2006.01)
*G06Q 10/00* (2012.01)
*G06F 3/06* (2006.01)

(52) U.S. Cl.
CPC ........ *G06F 17/5009* (2013.01); *G06F 3/0605* (2013.01); *G06Q 10/00* (2013.01)

(58) Field of Classification Search
CPC .. G06Q 10/00; G06Q 30/08; G06F 17/30067; G06F 13/00; G06F 3/0605; G06F 12/023; G06F 17/30292; G06F 12/02; G06F 9/5061
See application file for complete search history.

(56) References Cited

U.S. PATENT DOCUMENTS

| 8,539,197 | B1* | 9/2013 | Marshall | G06F 13/00 711/112 |
| 8,694,400 | B1* | 4/2014 | Certain | G06Q 30/08 705/26.3 |
| 8,849,758 | B1* | 9/2014 | Sivasubramanian | G06F 3/061 707/636 |
| 8,856,483 | B1* | 10/2014 | Paterson-Jones | G06F 12/023 711/170 |
| 9,880,786 | B1* | 1/2018 | Brown | G06F 3/0665 |
| 2007/0283360 | A1* | 12/2007 | Koretz | G06F 9/5061 718/105 |
| 2010/0036851 | A1* | 2/2010 | Paterson-Jones | G06F 17/30067 707/636 |
| 2011/0238546 | A1* | 9/2011 | Certain | G06Q 10/00 705/34 |
| 2014/0114933 | A1* | 4/2014 | Chandrasekarasastry | G06F 12/02 707/692 |
| 2014/0279838 | A1* | 9/2014 | Tsirogiannis | G06F 17/30292 707/603 |
| 2015/0347047 | A1* | 12/2015 | Masputra | G06F 3/0605 711/114 |

* cited by examiner

*Primary Examiner* — Kandasamy Thangavelu
(74) *Attorney, Agent, or Firm* — Davis Wright Tremaine LLP

(57) ABSTRACT

A data storage service may operate one or more storage servers configured to maintain logical volumes on behalf of customers of the remote data storage service. The logical volumes may have various dimensions. The various dimensions may be used to generate an average volume. The average volume may then be used to execute a simulation of an amount of remaining storage capacity of the data storage service.

20 Claims, 8 Drawing Sheets

SIMULATING DEMAND AND LOAD ON STORAGE SERVERS

BACKGROUND

The use of remote computing services, such as remote program execution and remote data storage, has greatly increased in recent years. Customers may reduce expenses and overhead by purchasing these services from a computing resource service provider (also referred to as a service provider). Customer applications may be distributed over multiple virtual machine instances and computing systems. The virtual machine instances may be controlled by a virtualization layer operating on a computing system. The virtualization layer may expose one or more logical volumes to the virtual machine instances. The logical volumes may be implemented by one or more data storage servers using one or more block-level storage devices. The data storage servers implementing the logical volumes may be distributed over various geographical regions. Furthermore, the logical volume may be duplicated on a plurality of the data storage servers. The service provider may ensure that the duplicate volume contains the same information and when customers modify the logical volume the modifications are reflected in each duplicate logical volume.

Providing remote services in a cost-effective manner can be challenging. For instance, a computing resource service provider can use the same hardware to support multiple resources. While, on average, the hardware may be able to support the resource usage demand of multiple customers, there can be points at which overloading occurs. The computer resources that provide services to customers may employ various techniques to protect the computer resources from an overwhelming number of service requests that could potentially overload the computer resources. In general, a computer resource is considered to be in an "overloaded" state if it is not able to provide the expected quality of service for at least some portion of customer requests it receives. Furthermore different hardware and software configurations of the computing resources used to provide remote program execution and remote data storage may affect performance and degradation of the computing resources during intervals of heavy utilization. It may be difficult for the computing resource service provider to determine which combinations of hardware and software configurations will perform the best for the given situation or have a higher risk of performance degradation, for example during intervals of heavy utilization by customers of the computing resource service provider.

BRIEF DESCRIPTION OF THE DRAWINGS

Various techniques will be described with reference to the drawings, in which.

DETAILED DESCRIPTION

Figure 1:
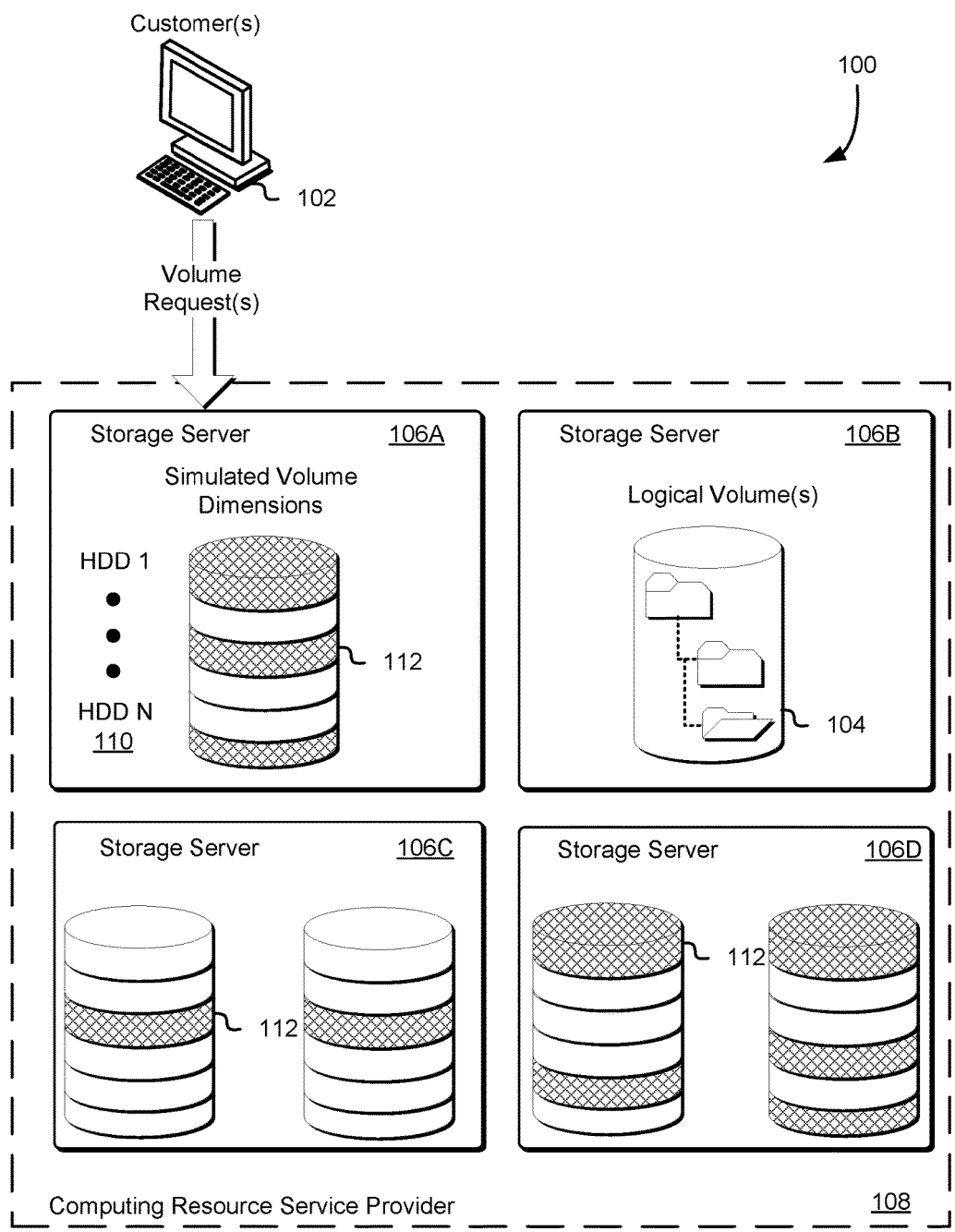
FIG. 1 illustrates an environment in which an average of various dimensions of customer volumes may be used to generate a simulated volume to determine an amount of remaining storage capacity in accordance with at least one embodiment.

In various examples described below, a data storage service of a computing resource service provider provides data storage services, and the data storage service may use one or more network attached storage devices, such as block-level storage devices, to provide data storage for customers of the computing resource service provider. To reduce the cost of the computing resources, such as the block-level storage devices, provided to the customers of the computing resource service provider, computer systems providing the customers with access to the computing resources and utilization of the computing resources may be monitored. In general, a customer may not consume the entire portion of the computer systems resources allocated to the customer. For example, a customer may only utilize 100 gigabytes (GB) of a 500 GB volume allotted to the customer. This information enables the computing resource service provider to increase efficiency and reduce the amount of un-utilized or under-utilized computing resources made available to customers. In some instances, such as when a hardware device is used to support computing resources for multiple customers, the hardware device may become overloaded when multiple customers attempt to consume the entire portions of their allotted computing resources at or near the same time. To prevent exceptions and/or errors which may occur when there is insufficient computing resource capacity to fulfill customer requests, various techniques described herein may be used to determine an amount of remaining computing resource capacity and mitigate such exceptions and/or errors.

In one example, the storage service may provide customers with logical volumes comprising a number of partitions, each volume may include a master partition and a slave partition stored on different data storage servers. The partitions include various dimensions (e.g., allocated computing resources) such as a number of bytes, a number of Input/Output Operations per Second (IOPS), a number of slots, and other computing resources that may be allocated to the customer's logical volume. The data storage service may include a modeling subsystem which may run simulations to determine an amount of remaining capacity of the data storage. The simulations may include placing a simulated volume/partition (e.g., an average partition) on the data storage servers until the computing resources of the data storage servers are consumed. The simulations may be run within or across regions and/or data zones, hardware configurations, logical volume types, customers, or other factors suitable for determining an amount of remaining computing resource capacity. Regions and/or data zones are logical divisions of resources such that failure of one fault zone may not affect servers in the other zones (e.g., grouped by geographic regions, data centers, hard drive clusters, backup generators, etc.). These simulations may determine a number of placeable partitions within a set of data storage sets, a region, data zone, or other distinguishing characteristic. In various examples, the number of placeable partitions is the number of partitions that are able to place in a zone, while satisfying data storage server remaining capacity and rack diversity requirements within the zone.

For example, the modeling system determines that the average partition contains the following dimensions: 1,000,000 bytes, 1,500 IOPS, and 1 slot. For a particular data zone the modeling system determines a number of partitions consisting of the average partition dimensions that may be placed on the data storage servers in the particular data zone. This provides capacity planning and monitoring information. For example, if there are only 5 placeable partitions in a particular region and the average number of new customer partitions in the region a day is 2, then the computing resource service provider can estimate that the region will be out of capacity in 3 days. This may enable the computing resource service provider to add additional capacity to the region.

In another example, the modeling system may generate a simulated volume and/or simulated volume information based at least in part on the average volume or partition and/or a predicted volume or partition. The simulated volume may include various attributes or dimensions of the average volume modified to predict future utilization by customers. As used herein the average volume or partition includes a simulated volume generated to predict future utilization/behavior of customer (e.g., the average customer volume at some point in the future). Furthermore, the modeling system may track a rate-of-change of the number of placeable partitions and/or average partition. An increase or decrease in the rate-of-change over an interval may trigger an alarm. In addition, a number of placeable partitions exceeding a threshold may also trigger an alarm. These alarms may enable the computing resource service provider to better respond to customer demands and customer utilization of computing resources provided by the computing resource service provider.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

FIG. 1 illustrates an example environment 100 where one or more computer systems, as well as the associated code running thereon, may provide customers 102 with logical volumes 104 wherein the logical volume may be stored by a service provider 104 using storage servers 106A-106D. Customer data may be stored across a variety of different data storage servers 106A-106D of the same or different types containing one or more storage devices such as block-level storage devices, illustrated in FIG. 1 as HDDs1 through N 110. The block-level storage devices may be configured to store data on platter surfaces in microscopic magnetic regions. In other embodiments, the block-level storage devices are solid state drives (SSD) or a hybrid drive (e.g., a solid state and disk drive combination). The customer data stored on the different devices may be exposed, as the logical volume 104, to a computer system operated by the customer. The logical volume 104 may contain a file system (illustrated in FIG. 1 as folders and subfolders). The file system on the logical volume 104 may separate data into individual and/or logical pieces organized into groups referred to as files. The logical volume 104 may support a variety of file systems. The customer may instantiate one or more virtual machines on computing resources of the computing resource service provider 108, and the one or more virtual machines may attach the exposed logical volumes 104 to enable the customer to interact with the data stored in the logical volumes 104 maintained by the data storage service using one or more storage servers 106A-106D. The logical volumes 104 may contain one or more files which are simultaneously accessible to multiple computer systems operated by customers 102 of the computing resource service provider 108. In addition, the logical volumes may be divided and/or split into one or more partitions, including one or more replicas of the partitions as described in greater detail below in connection with FIG. 4.

As described above, the computing resources of the storage servers 106 may be use to support multiple customers and, as a result, the storage servers 106 may receive more requests than the storage servers 106 are capable of responding to during intervals of heavy customer 102 activity. For example, the customers 102 may request storage of 1,000 terabytes (TB) of data on storage server 106A, however the storage server 106A may only have 500 TB of available storage space. The storage servers 106A-106D may be further limited by a maximum number of IOPS the storage servers 106A-106D may perform. For example, as described above, a particular HDD may have a maximum of 100 IOPS and the storage server 106A may have 12 HDDs with a maximum of 100 IOPS, therefore the storage server 106A may have a maximum of 1,200 IOPS. The maximum number of IOPS may be determined based at least in part on a number of random input and output (I/O) operations the storage device may complete in an interval of time. However, the storage device may be capable of exceeding the maximum number of IOPS in various situations, such as, for a set of sequential I/O operations.

For the purposes of the present disclosure, the maximum number of IOPS may be an estimation of the capabilities of a particular storage device and the actual number of IOPS achieved by the particular storage device may exceed or fall short of the maximum number of IOPS. Additionally, the storage servers 106A-106D responses may be limited by a maximum throughput of the block-level storage devices included in the storage servers. The throughput of a particular block-level storage device (e.g., data transfer rate) may include both the internal rate and the external rate. The internal rate may include the rate at which data may be transmitted between components of the particular block-level storage device, such as between a disk surface and a controller of the particular block-level storage device. The external rate may include the rate at which data may be transmitted between the particular block-level storage device and external hardware, such as between the controller of the particular block-level storage device and the storage servers 106A-106D. The maximum throughput and maximum IOPS of the storage servers 106A-106D may be considered as a dimension of the storage servers 106A-106D and in turn a dimension of the logical volumes 104 supported by the storage servers 106A-106D.

As illustrated by FIG. 1, the storage servers 106A-106D may include a pool or other collection of storage devices 1 through N configured to store data on behalf of customers 102 of the computing resource service provider 108. As described in greater detail below, the storage servers 106 may contain a number of placeable partitions 112. The number of placeable partitions 112 may be determined based at least in part on an average of one or more dimensions of the logical volumes 104 or partitions thereof. Customers 102 may request logical volumes 104 with particular attributes or dimensions such as a number of partitions, number of byte (e.g., size of the volume), throughput, IOPS, performance, or other information suitable for providing customers with logical volumes 104. The customers 102 may request logical volume programmatically through the use of application program interface (API) calls to a web service front end or other component of the data storage service. A modeling subsystem described in greater detail below, may utilize the attributes or dimensions of the logical volumes 104 to determine an average customer volume and/or partitions thereof.

In addition the modeling subsystem may generate a simulated volume based at least in part on the attributes or dimensions of the logical volumes 104. The simulated volume may attempt to predict or model future customer behavior. For example, a customer may notify the computing resource service provider 108 of a future intention to create a large number of volumes of a particular size and type with a certain amount of throughput and latency. This information may be utilized to generate a simulated volume and determine an amount of capacity of the data storage server based at least in part on the simulated volume. Other mechanisms for predicting demand and utilization of computing resources by customers of the computing resource service provider 108 may be used to determine simulated volumes and/or modifications to the average volume information to encompass predicted demand and utilization. The average volumes and/or simulated volumes may be compared across regions, fault zones, data zones, data centers, and other logical groupings of data storage servers to determine if the average volumes and/or simulated volumes are skewed or should otherwise be modified relative to at least one other logical grouping of data storage servers.

The average customer volume may be used by the computing resource service provider 108, or component thereof such as the modeling subsystem, to execute one or more simulations of the number of placeable partitions 112 available on the storage servers 106A-106D under various hardware and/or software configurations. The computing resource service provider 108 may use the result of the simulations to improve capacity planning, utilization, and monitoring. For example, computing resource service provider 108 can provide customers 102 with feedback and provide suggestions for various services offered by the remote storage service and/or computing resource service provider 108 that may result in greater cost savings or better storage performance. Additionally, the simulations may be used to determine future load and resource utilization on the storage servers 106A-106D, which may be used to modify one or more attributes of the storage service, such as, a capacity of the storage server advertised to customer 102 or other components of the computing resource service provider 108, hardware and/or software configurations of the storage servers 106A-106D, and any other attribute suitable for optimizing the performance of the storage servers 106A-106D in the one or more dimensions. The hardware configuration of the storage servers 106 may include network interfaces, rack, switches, HDDs, solid-state drives or other storage devices, processors, memory, or any other physical component of the storage servers 106A-106D. The software configuration of the storage servers 106A-106D may include logical volume placement algorithms, operating systems, hypervisors, throttling applications or other application managing customer access to computing resources of the storage servers 106A-106D, and any other application loaded into memory of the storage servers 106A-106D.

In various embodiments, the storage servers 106A-106D involved in implementing the volumes may collect placement information and logical volume 104 information to be used during execution of the simulations described above. Additionally, a certain amount of computing resources may be required to satisfy the requirements of the customers 102 of the computing resource service provider 108. For example, the data storage service may provide the customers 102 with access to block-level storage devices, e.g., HDD 1 through N illustrated in FIG. 1. The block-level storage devices may have a certain number of IOPS that the block-level storage devices are capable of executing. For example, a particular block-level storage device may have a maximum of 1,500 IOPS that the particular block-level storage device is capable of performing.

Furthermore, the block-level storage devices may have a certain capacity, e.g., a particular block-level storage device may have a maximum capacity of 2 TBs which may be utilized to provide customers 102 with logical volumes 104, as described above, to stored data for the customers 102. The storage servers 106A-106D providing computing resources to the customers of the computing resource service provider may include a plurality of block-level storage devices and slots for additional block-level storage devices which may be added later. Each block-level storage device may have a maximum size and a maximum number of IOPS. For example, a particular storage server may include six 1 TB hard disk drives (HDD) with a maximum IOPS of 1,000 and six 4 TB HDD with a maximum IOPS of 1,000. The particular storage server would have 30 TB of storage with a maximum IOPS of 12,000. In addition, to the maximum amount of storage and IOPS a particular storage server may have a maximum number of placement slots. The maximum number of placement slots is the total number of partitions the particular storage server may support regardless of storage capacity and throughput. Returning to the example above, the particular storage server may include a total of 2,000 slots, as a result when the particular storage server contains 2,000 partitions all of the storage server's capacity is utilized regardless of the number of bytes and/or throughput remaining.

In addition, the dimensions (e.g., bytes, IOPS, and slots) of the storage servers 106A-106D may be further broken down into categories and/or subcategories. For example, the number of bytes of a particular storage server may be categorized as used bytes, free bytes, sold bytes (e.g., byte provided to the customers 102), sellable bytes (e.g., bytes that may still be provided to the customers 102, which may be based on one or more constraints: such as an amount of bytes that may be multiple customers), or other categories suitable for simulating demand and capacity for the storage servers 106A-106D. These dimensions for both the storage servers 106A-106D and the average customer volume may be monitored for various intervals of time to determine a rate of change. The rate of change may be the ratio between dimensions per interval of time. Furthermore, the average of a particular dimension (e.g., the number of bytes in an average customer volume and/or partition) may include a variety of statistical calculations such as the arithmetic mean, the geometric mean, harmonic mean, weighted mean, quadratic mean, and other statistical locations such as the mode, median, and mid-range.

Figure 2:
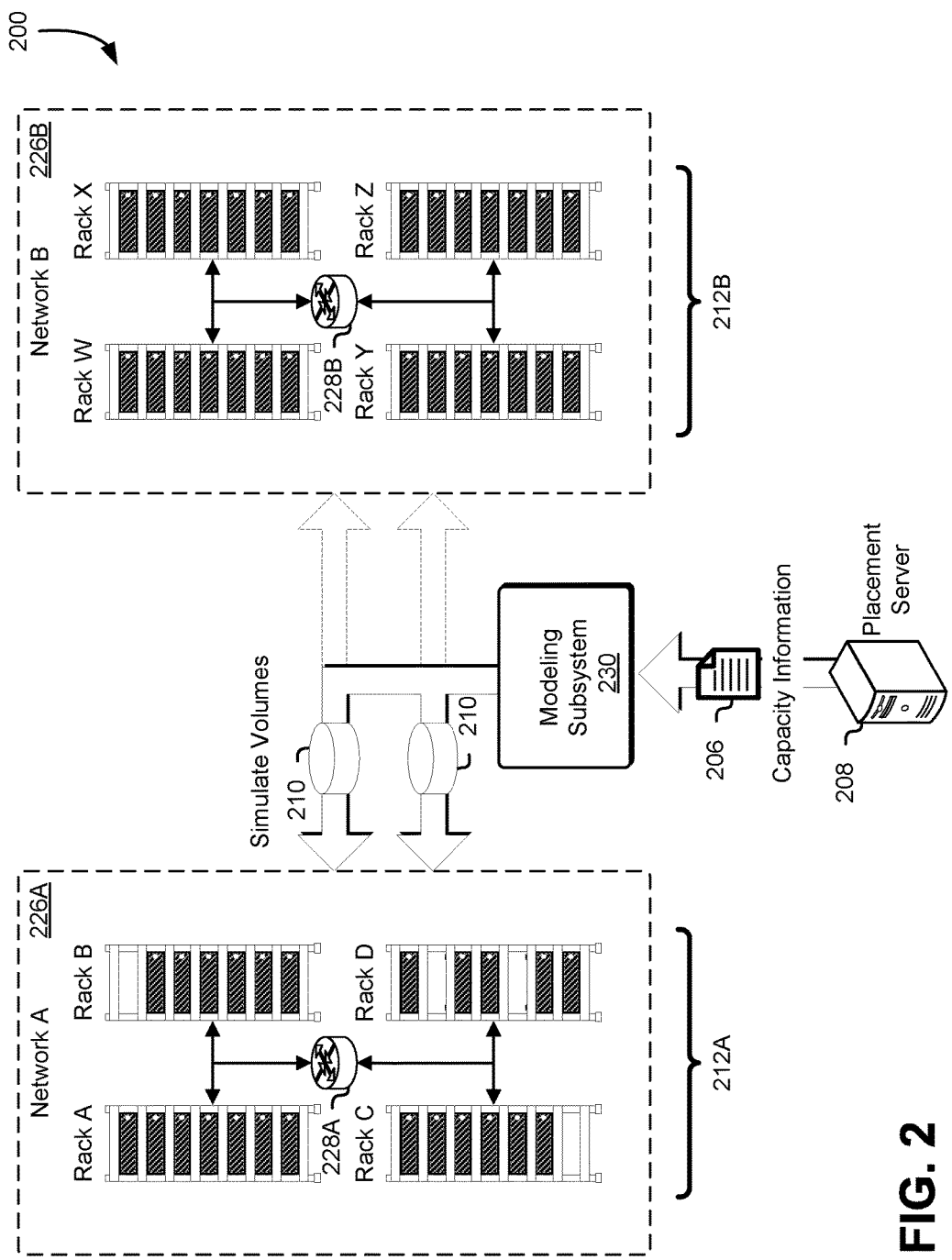
FIG. 2 illustrates an environment in which a modeling subsystem may determine an amount of remaining storage capacity in accordance with at least one embodiment.

FIG. 2 illustrates an aspect of an environment 200 in which an embodiment may be practiced. Specifically, FIG. 2 depicts simulation volume and/or partition placement on racks within a locality. The environment 200 may include a placement server 208 provides capacity information 206 used by a modeling subsystem 230 for placing partitions of simulated volumes 210 on data storage servers in the sets of racks 212A-212B according to a rack diversity constraint and capacity information 206, where the sets of racks 212A-212B may be localized by different networks 226A-226B, regions, or data zones. The capacity information 206 may be information corresponding to various dimensions of the storage servers in the racks 212A-212B, such as sold bytes, sellable bytes, sold IOPS, sellable IOPS, sold slots, sellable slots, and other dimensions as described above in conjunction with FIG. 1. The modeling system 230 may include logic or other executable code that, as a result of being executed by one or more processors (e.g., processors included in the servers in racks 212A-212B) cause the server to execute placement simulation utilizing simulated volumes to determine an amount of remaining capacity and/or computing resources of the servers.

The placement server 208 may be a computing system of one or more computing systems configured to attempt to place partitions on data storage servers based at least in part on replica and diversity constraints and maintain information associated with the data storage servers. The partitions may be specified partitions of the simulated volumes 210 and based at least in part on an average customer partition of volumes supported by the data storage servers of the racks 212A-212B. The average customer partition may be the average for the network 226A-226B, region, data zone, rack 212A-212B, data storage server, or other component of the data storage service. In addition, the average customer partition may span multiple components of the data storage service. For example, the average customer partition may be determined based at least in part on the volumes in network 226A and network 226B. Furthermore, the racks 212A-2121B may contain different hardware configurations, illustrated in FIG. 2 as empty slots or "holes" in the racks 212A-212B. The modeling subsystem 230 may simulate placing simulated volumes 210 (e.g., predicted average customer partitions determined based at least in part on the logical volumes in network 226A) on the data storage servers in rack 212A. In addition, a simulation utilizing the same simulated volumes 210 may be executed on the data storage service in rack 212B. The simulated volumes 210 may include a variety of different simulated volumes 201. For example a portion of the simulated volumes 210 may include a more optimistic or pessimistic prediction of average customer volumes. More specifically, a first portion of the simulated volumes 210 may include larger values for one or more dimensions such as bytes, IOPS, throughput, and/or latency and a second portion of the simulated volumes 210 may include smaller values for the one or more dimensions. In this way, predictions of various different customer utilizations and demands may be simulated. Furthermore, the simulated volumes 210 may be used to determine an amount of time remaining before there is insufficient capacity remaining on the data storage servers. For example, there may be remaining capacity for 75 simulated volumes 210 of a first type and 50 simulated volumes 210 of a second type. Based at least in part on this information the computing resource service provider may predict a number of days until there is insufficient capacity remaining on the data storage servers.

The sets of racks 212A-12B may be physical hardware configured to host one or more servers, or, in some embodiments, may simply be logical groupings of the one or more servers, such as the data storage servers of FIG. 1. Examples of logical groupings other than by rack may include servers grouped together based on data center location, servers in different fault isolation groups (i.e., logical divisions of resources such that failure of one fault zone may not affect servers in the other zones; e.g., grouped by geographic regions, data centers, hard drive clusters, backup generators, etc.), servers grouped together based on performance characteristics (e.g., throughput, input/output operations per second, number of bytes or slots etc.), and so on. The servers in a rack may be members of a particular network. In some implementations, multiple racks of servers may be members of the same network. For example, as illustrated in FIG. 2, the servers of the set of racks 212A share the network 226A. Likewise, the servers of the set of racks 212B share the network 226B.

The networks 226A-226B may be data communication pathways between one or more electronic devices. The networks 226A-226B may be wired or wireless networks and may use any of a variety of communications protocols for organizing their network traffic. The networks 226A-226B may allow the sharing of files, data, and other types of information between the one or more electronic devices accessible through the data communication pathways. Each of the networks 226A-226B may be associated with a router, such as an aggregation router that aggregates the servers of the respective set of racks into the common network, separate from the router associated with the other network. Each of the networks 226 A-226B may be on a different subnet than the other network. For example, as illustrated in FIG. 2, the servers of the set of racks 212A may be commonly connected to a router 228A. Similarly, the servers of the set of racks 212B may be commonly connected to a router 228B. The routers 228A-228B may be networking devices that forward packets between computer networks, such as between the networks 226A-226B.

In terms of placement requirements and data replication requirements, described in greater detail below in connection with FIG. 4, a rack diversity constraint may specify that placements should be weighted to prefer data storage servers within the same network locality as a physical host of one or more replica partitions of the volume. Note, in some cases, partitions of a volume are not placed within in the same network as replicas of volume (for example, there may be no servers available in the network for hosting the partitions). Alternatively, the constraint may be configured such that the partitions should be placed in different networks from each other. During simulations of the placement of the simulated volumes 210 the modeling subsystem 230 may adhere to placement requirements and data replication requirements to accurately determine an amount of remaining capacity. The modeling subsystem 230 may determine the average customer partitions and execute a simulation at various intervals, such as every 5 minutes. A result of the simulations may be maintained by the modeling system 230 and monitored to determine a rate of change over various intervals, such as a 30-day trailing average. The molding subsystem 230 may provide information associated with the simulations to one or more other systems of the computing resource service provider. In addition, the modeling system 230 may transmit an alarm or a notification if the result of the simulation or the rate of change exceeds a threshold.

Figure 3:
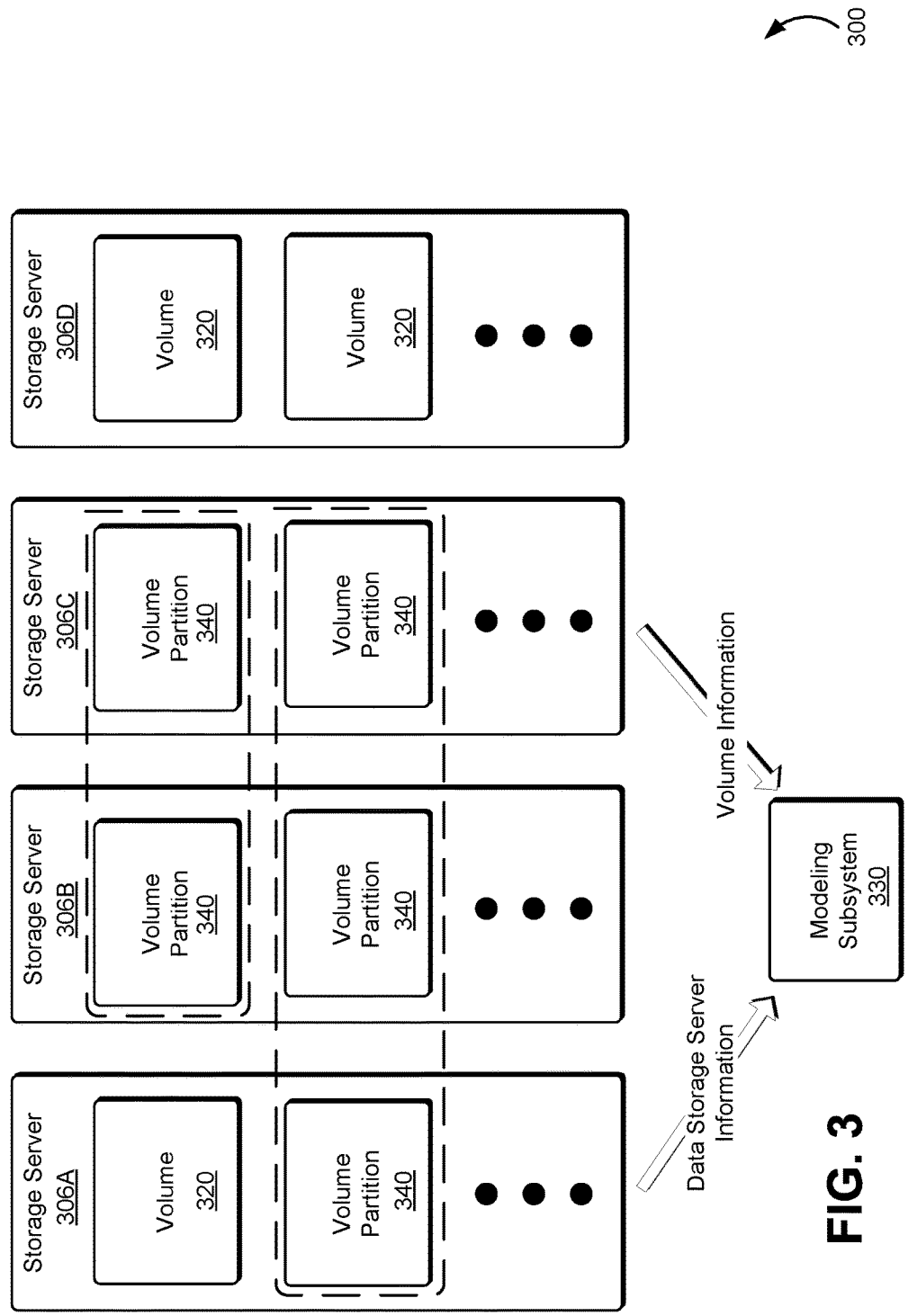
FIG. 3 illustrates an environment in which a modeling subsystem may obtain information to determine an amount of remaining storage capacity in accordance with at least one embodiment.

FIG. 3 illustrates an environment 300 in which various aspects or dimensions of data storage servers 306A-306D and volumes may be obtained by a modeling subsystem in accordance with at least one embodiment. The environment 300 may be the modeling subsystem 330 obtaining information from storage servers 306A-306D in order to determine an amount of remaining capacity of a data storage service. The simulation may be performed by the modeling subsystem 330 and may include one or more simulated volumes based at least in part on a set of volume partitions 340 and/or volumes 320 (e.g., logical volumes without partitioning). The modeling subsystem may obtain volume information, including partition information, directly from the data storage servers 306A-306D or, as described above in connection with FIG. 2, from an intermediary such as a placement server.

As described above, the volume information may include various dimensions or characteristics of the volumes 320 and volume partitions 340. The volume information may also include utilization information for each dimension. For example, a particular volume partition may be allotted a maximum of 1 TB, however the customer may only be utilizing 250 GB of the entire allotted size of the particular volume partition. Using this information the modeling subsystem 330 may generate an average volume and/or volume partition for the storage servers 306A-306B. For example, the average volume partition for the storage servers 306A-306B may have the following dimensions: 750 GB maximum available capacity, 175 GB utilized capacity, 1,000 available IOPS, 365 utilized IOPS, and 1 slot. As illustrated by the dashed lines in FIG. 3, volume partitions may be distributed across a plurality of storage servers 306A-306D. In addition, the average partition may not be representative of the volumes 320 and volume partitions 340 requested and utilized by customers of the computing resource service provider.

Similarly, the dimensions of the various the storage servers 306A-306B may be obtained by the modeling system. This information may be utilized by the modeling subsystem 330 to perform a simulation to determine an amount of remaining capacity for the storage servers 306A-306B. For example, the data storage server information may indicate the particular data storage server has the following dimensions: 100 TB maximum capacity, 55 TB utilized capacity, 5,000 maximum IOPS, 2,500 utilized IOPS, and 250 slots. The modeling system may simulate the placement of volumes and/or volume partitions on the particular storage server. The result of the simulation may be a metric or other score indicating an amount of capacity remaining for the particular data storage server. In some examples, the 'score' and/or 'metric' may refer to a value that is correlated with a likelihood the storage servers 306A-306D will produce an insufficient capacity exception when a customer attempts to create and volume 420 or volume partition 340. The score may be computed based at least in part on various simulations executed by the modeling subsystem 330. Depending on the dimensions of the simulated volume different dimensions of the storage servers 306A-306B may be exhausted before others. Returning to the example above, if the simulated volume (e.g., average customer partition or volume) contains 20 TB and only 200 IOPS, the particular storage server will deplete the 45 TB remaining of storage capacity (e.g., the 100 TB maximum capacity minus the 55 TB utilized capacity) prior to depleting the 2,500 remaining IOPS during the simulation. This may indicate a particular dimension of the storage servers 306A-306D which may be bounded or otherwise limited.

Four storage servers 306A-306D are shown in FIG. 3. Partitioned volume 340 is illustrated, with five partitions, while three non-partitioned volumes 320 are shown. In some embodiments in which partitioned volumes are supported, non-partitioned volumes may simply be managed as volumes that each comprise a single partition. Both partitioned and non-partitioned volumes may be attached to multiple computer systems in the depicted embodiment, e.g., as a result of various customer requests to attach a volume. Partitioned volume 340 may be attached to multiple computer systems, while non-partitioned volume 320 may be attached to a single computer system. A given computer system may be attached to more than one multiply-attached volume in at least some embodiments. Various configurations of the storage servers 306A-306D may be simulated and tested using the data as described above. Although only one configuration of the storage servers 306A-306D is shown in FIG. 3, any number of hardware and/or software configurations may be used in environment 300 for the purpose of determining capacity of various configurations of the storage server 306A-306D and/or optimizing the storage server 306A-306D on one or more dimensions, such as, capacity, IOPS, number of slots, power consumption, risk of degradation, performance, and other dimensions described herein.

Figure 4:
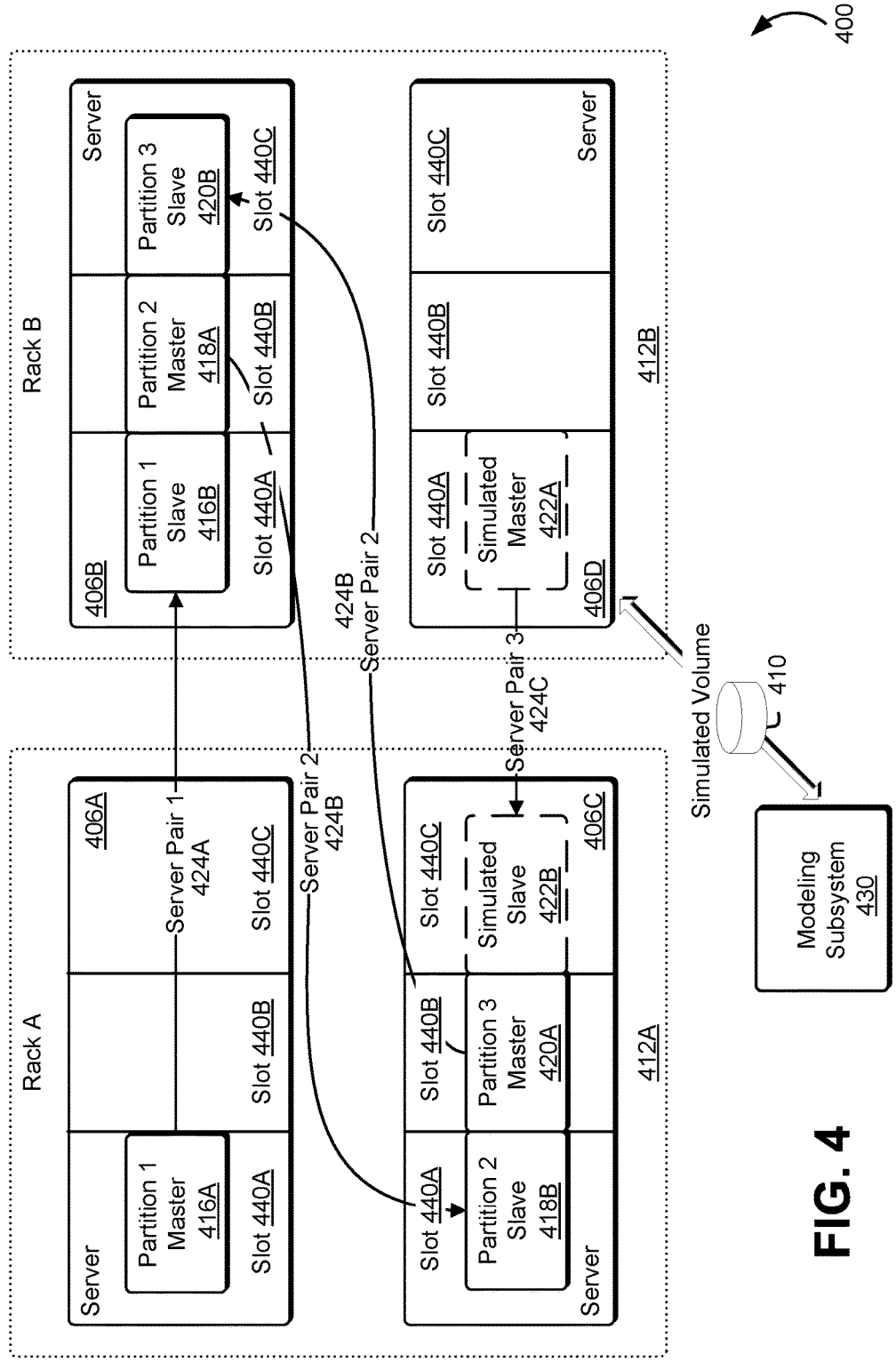
FIG. 4 illustrates an environment in which a modeling subsystem may determine an amount of remaining storage capacity in accordance with at least one embodiment.

FIG. 4 illustrates an aspect of an environment 400 in which an embodiment may be practiced. Specifically, FIG. 4 depicts partitions 416A-416B, 418A-418B, 420A-420B, and simulated partitions 422A 22B distributed among servers 406A-406D between two racks 412A-412B to illustrate partition placement for server pair diversity during simulations as described above. The racks 412A-412B may be racks similar to the racks 212A-212B described in conjunction with FIG.2. Although illustrated as having only two servers each (406A and 406C/406B and 406D), this is for illustration purposes only and the racks 412A-412B may host any number of servers. Furthermore, not all implementations may have actual physical racks. Instead, in some implementations the elements depicted as racks 412A-412B may simply be groupings of servers. The groupings of servers may share a common power source, share the same network, be located in the same room of the data center, or may be grouped according to some other scheme. The servers may therefore be any of a variety of types of servers, including but not limited to rack-mounted servers. The physical hardware of the servers may include such hardware as would be sufficient to provide corresponding services, such as data storage services, to customers of the computing resource service provider (such as the server hardware described in conjunction with FIGS. 1 and 2). The servers may each have a set of data storage devices, such as a hard drive array, for storing partitions of volumes. Furthermore, the servers 406A-406D may include a number of slots 440A-440C. The slots 440A-440C may correspond to a number of partitions the servers 406A-406D may support as described above. Each partition may correspond and/or consume one or more slots 440A-440C on the servers 406A-406D.

A server hosting a master partition and a server hosting a slave partition corresponding to the master partition comprise a server pair. In some embodiments, a placement strategy may be to keep the number of replica pairs shared between server pairs to a minimum. In the environment 400, a request has been received to place a simulated volume 410 on a particular server. The request may be part of a simulation to determine an amount of capacity of the particular server or servers, racks 412A-412B, networks, regions, zones, or other computer systems, grouping of computer systems, or logical grouping of computer systems as described herein. In various embodiments, the request is a request for information about the current dimensions of the servers 406A-406B in order to complete the simulation as opposed to a request to actually place the simulated volume 410 on the servers 406A-406B. For example, the modeling subsystem 430 may request information corresponding to a server pair that would support the partitions of the simulated volume 410 based at least in part on the placement strategy.

Consequently, a simulated partition master 422A has been placed on a first server 406DA and its corresponding simulated partition slave 422B has been placed on a second server 406C. The simulated volume 410 and corresponding partition master 422A and partition slave 422B may utilize a simulated server pair 424C. The modeling subsystem 430 utilizes the placement constraints (e.g., server pair information) to simulate the placement of simulated volumes 410 on the servers 406A-406D. In addition other partitions and volumes may have been previously instantiated and are currently operating on the servers 406A-406D, for example, a first partition replica pair consisting of a partition master 416A on server 406A and a partition slave 416B on server 406B; a second partition master 418A on the second server 406B and its corresponding second partition slave 418B on server 406C. Thus, in this illustration, the servers 406A and 406B hosting the first partition replica pair form a first server pair 424A. The servers 406B and 406C hosting the second partition replica pair form a second server pair 424B. A third partition replica, as illustrated in FIG. 4, includes a third partition master 420A on the third server 406C and its corresponding third partition slave 420B on the second server 406B. This third partition replica pair consequently utilizes the same server pair as the second partition replica pair. Server pairs 424A and 424B may support customer partitions that consume resources and/or capacity of the servers 406A-406D and may be included in the determination of the average partition for use in the simulated volume 410 by the modeling subsystem 430.

As noted, in some embodiments a partition strategy may, in addition to following rack diversity, availability, and durability constraints, include keeping server pair counts low. As can be seen, the server pair count for the first server pair 424A is one; that is, there is only one partition replica pair (416A-16B) shared between the first server pair 424A. On the other hand, the server pair count for the second server pair 424B is two; that is there are two partition replica pairs (418A-18B and 420A-20B) shared between the second server pair 424B. Also note, that although the server pairs 424A-24C illustrated in FIG. 4 are shared between the two racks 412A-12B, each of the servers 414A-14D of the racks 412A-12B may host members of replica pairs whose counterparts reside on servers in other racks (not pictured). For example, servers in the second rack 412B may be paired with servers in a third rack for the purpose of hosting half of a replica pair where the other halves of the replica pairs are on servers in the third rack. The placement of simulated volumes 410 may be constrained by various other factors. For example, placement may be constrained to data storage servers within the same logical grouping, such as data center, fault zone, network, region, or other grouping of data storage servers.

Figure 5:
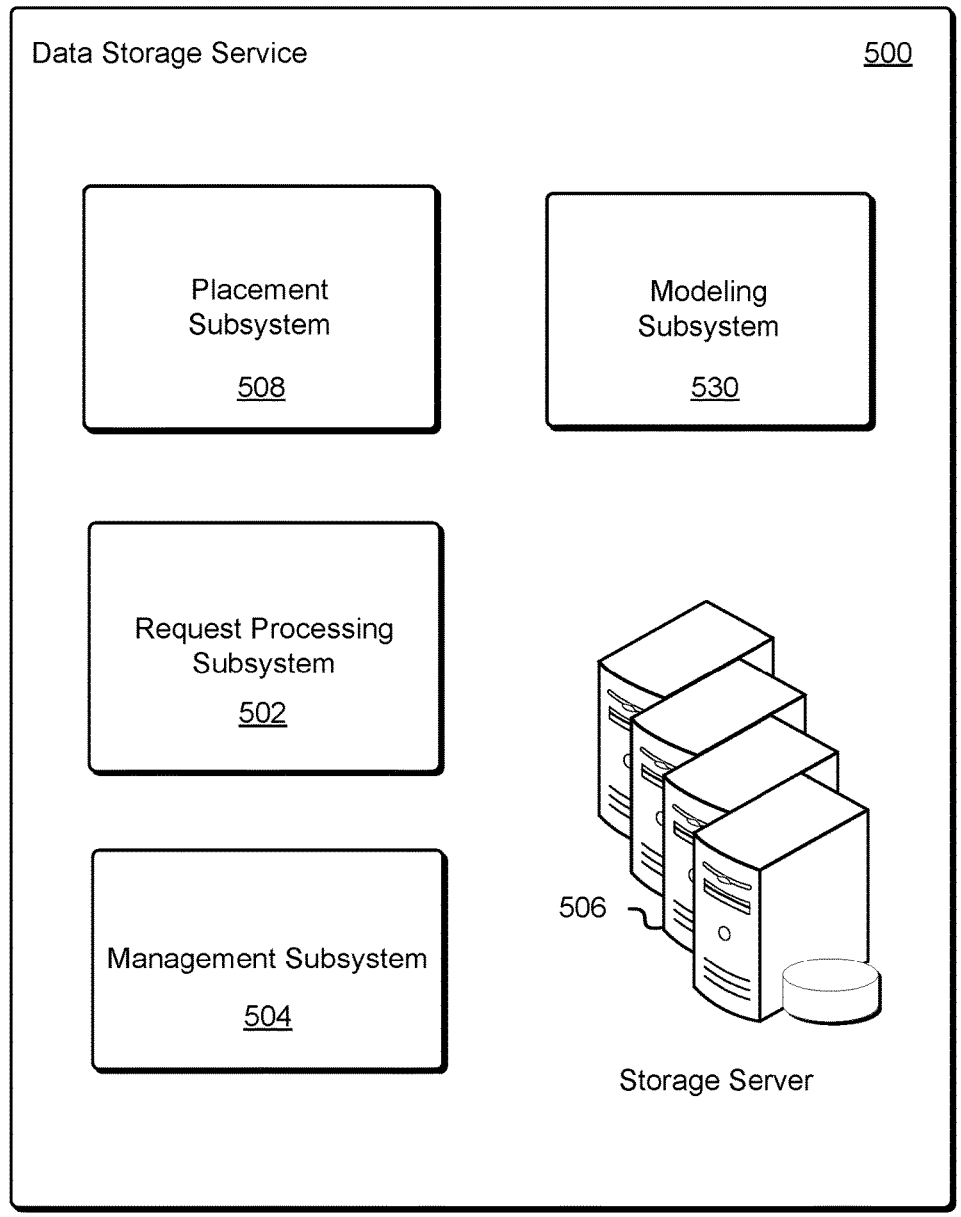
FIG. 5 illustrates an example data storage service in accordance with at least one embodiment.

FIG. 5 shows an illustrative example of a remote storage service 500 in accordance with at least one embodiment. The remote storage service 500 may be a service of a computing resource provider used to operate a block-level remote storage service such as described above in connection with FIG. 1. As illustrated in FIG. 5, the remote storage service 500 includes various subsystems such as a request processing subsystem 502, a modeling subsystem 530, a placement subsystem 508, and a management subsystem 504. The remote storage service 500 may also include a plurality of data storage servers 506, which may store data of various customer volumes and customer interactions with the customer volumes maintained by the data storage servers 506 as described above. Furthermore, the modeling subsystem, described in greater detail below, may provide metrics or scores representing an amount of capacity remaining of the storage servers 506 based at least in part on simulating the placement of simulated volumes (e.g., average customer partitions) on the storage servers 506.

In an embodiment, the request processing subsystem 502 is a collection of computing resources, such as webservers and application servers, collectively configured to process requests submitted to the remote storage service 500. The request processing subsystem 502, for example, may include one or more webservers that provide a web service interface to enable customers of the remote storage service 500 to submit requests to be processed by the remote storage service 500. The requests may include I/O requests and request to create a volume with defined dimensions as described above in connection with FIG. 1. The request processing subsystem 502 may include computer systems configured to make various determinations in connection with the processing of requests, such as whether policy allows fulfillment of a request, whether requests are authentic (e.g., electronically signed using a suitable cryptographic key) and otherwise. In various embodiments, the request processing subsystem 502 may volume and partition information (e.g., size, throughput, and other dimensions) from the requests as described above.

Components of the request processing subsystem may interact with other components of the remote storage service 500 (e.g., through network communications). For example, some requests submitted to the request processing subsystem 502 may involve the management of computing resources which may include data objects stored by the data storage servers 506. The request processing subsystem 502, for example, may receive and process requests to modify computing resources. For instance, in some examples, data objects are logically organized into logical data containers. Data objects associated with a logical data container may, for example, be said to be in the logical data container. Requests to the data processing subsystem 502 may include requests for creating logical data containers, deleting logical data containers, providing an inventory of a logical data container, providing or updating access control policy with respect to one or more logical data containers and the like.

The requests may be processed by the management subsystem 504 upon receipt by the request processing subsystem 502. If applicable, various requests processed by the request processing subsystem 502 and/or management subsystem 504 may result in the management subsystem 504 updating metadata associated with data objects and logical data containers stored in a metadata store. Additionally, the management subsystem may include a data store configured to maintain metrics information generated by the modeling subsystem 530, dimensions of the storage servers 506, and/or dimensions of the customer's volumes, described in greater detail above. The data store, for example, may be a database or other storage device configured to store dimensions of the storage servers 506 as records which may be retrieved by the modeling system 530 during execution of various simulations. Other requests that may be processed by the request processing subsystem 502 include requests to perform operations in connection with data objects. The requests, for example, may include requests to upload data objects to the remote storage service 500, to download data objects from the remote storage service 500, to delete data objects stored by the remote storage service 500 and/or other operations that may be performed.

Requests processed by the request processing subsystem 502 that involve operations on data objects (e.g., upload, download, delete) may include interaction between the request processing subsystem 502 and one or more data storage servers 506. The data storage servers 506 may be computer systems communicatively coupled with one or more storage devices for the persistence of data objects. For example, in order to process a request to upload a data object, the request processing subsystem may transmit data to a data storage server 506 for persistent storage. It is noted, however, that in some embodiments, client (e.g., customer) computer systems may transmit data directly to the data storage servers 506 instead of through servers in the request processing subsystem.

In some embodiments, the request processing subsystem 502 transmits data to multiple data storage servers 506 for the purposes of redundantly storing the data to allow the retrievability of data in the event of failure of an individual data storage server 506 and/or associated data storage device. For example, in some embodiments, the request processing subsystem uses a redundancy in coding scheme such as erasure coding to deconstruct a data object into multiple parts that are stored among the data storage servers 506. The parts may be configured such that if access to a certain number of parts is lost, the data object may nevertheless be reconstructible from the remaining parts that remain accessible.

To enable efficient transfer of data between the request processing subsystem 502 and the data storage servers 506 and/or generally to enable quick processing of requests, the request processing subsystem 502 may include one or more databases that enable the location of data among the data storage servers 506. For example, the request processing subsystem 502 may operate a key-value store that serves to associate identifiers of data objects with locations among the data storage servers 506 for accessing data of the data objects.

The placement subsystem 508 provides placement decisions for partitions across the storage servers 506 according to a rack diversity constraints. In addition, the placement subsystem 508 may provide capacity and dimension information used by the modeling subsystem 330 for placing partitions of simulated volumes storage servers 506 according to a rack diversity constraints and capacity information. Additionally, the placement subsystem 508 may contain information corresponding to the received requests, such as information about partition dimensions included in various received requests. Returning to FIG. 5, the placement subsystem 508 may consist of a set of computer systems communicating with the management subsystem 504 and the request processing subsystem 502 in order to fulfil customer requests and manage partitions distributed among the storage servers 506. Furthermore, the placement subsystem 508 may include information associated with the cost of various hardware components of the storage servers 506 in order to enable the modeling system 530 to select storage server configurations to use during simulations based at least in part on the cost of various components. The cost may include a historical cost paid for various hardware components or may include the current market cost of the various hardware components. The modeling system 530 may include the cost of the hardware in various models and use cost information when selecting a particular hardware and/or software configuration. For example, when selecting a storage server configuration and/or determining an optimal storage server configuration on one or more dimensions, the cost of the storage server may be included in the one or more dimensions. The cost of storage server configurations may have a greater influence than performance information of storage server configurations (e.g., information obtained from performing simulations of the storage server configurations as described above) when selecting a particular storage server configuration, such that a lower cost lower performing storage server configuration may be selected over a higher cost better performing storage server configuration. However, there may be minimum performance requirements to ensure that customers utilizing selected storage server configurations would not be significantly adversely affected by any potential cost savings from selecting a particular storage server configuration based at least in part on cost. Although the cost of hardware components is described herein, the cost of software components is considered within the scope of the present disclosure, and such costs may include licensing and development costs.

In various embodiments, the modeling subsystem 530 is a collection of computing resources, such as webservers and application servers, collectively configured to simulate a variety of different storage server 506 configurations using an average partition across a variety of dimensions to determine a number or amount of capacity remaining on the storage servers 506. The simulations may be used to determine the probability of a particular storage server configuration becoming overloaded and/or exhausting capacity and customers of the remote storage service receiving a degradation of service as a result. Furthermore, the modeling system 530 may provide recommendations to customers for different configurations of customer volumes in order to improve the performance of the customer's logical volume and/or reduce the cost associated with the customer's volumes. The modeling system 530 may be configured to obtain data from the other components of the data storage service 500, execute various simulations, and determine an optimal configuration of the storage servers 506. In addition, the modeling subsystem 530 may provide metrics information to other services such as a capacity management and monitoring service. This information may be used to determine when to purchase and install additional hardware to meet customer demand. For example, if the result of a simulation executed by the modeling subsystem 530 indicates that the remaining capacity of the storage servers 506, or portion thereof, is below a threshold, this may indicate to the capacity management and monitoring service to purchase additional servers and other hardware components to provide additional capacity.

Figure 6:
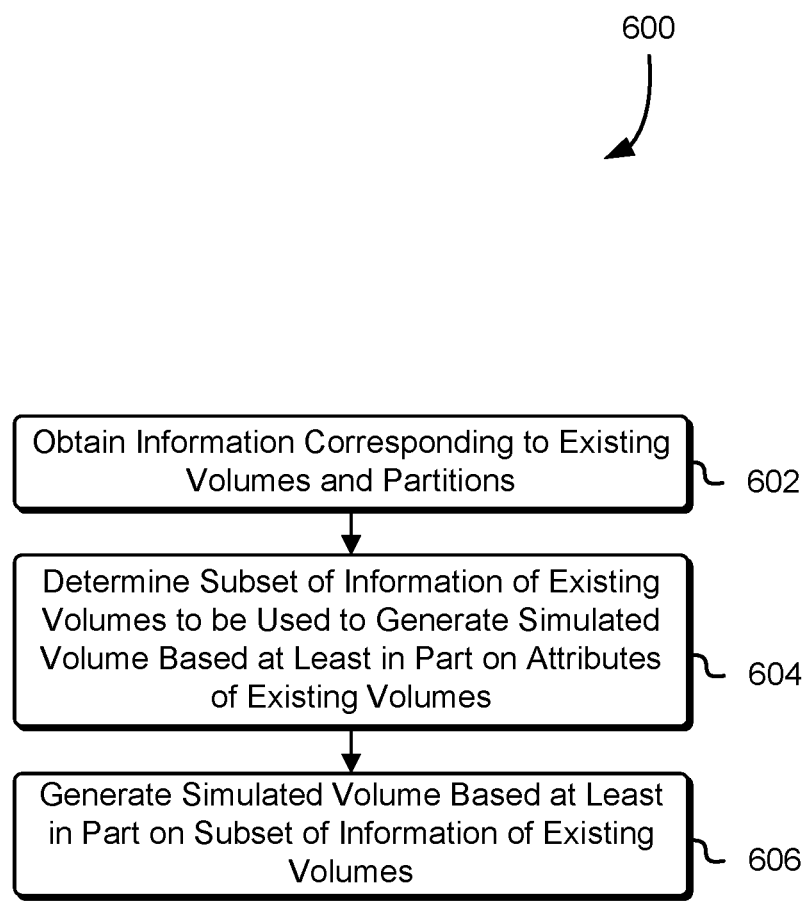
FIG. 6 shows an illustrative process which may be used to generate a simulated volume for use in determining a remaining storage capacity in accordance with an embodiment.

FIG. 6 is a block diagram illustrating an example of a process 600 for generating an average volume and/or partition for use in various simulations in accordance with at least one embodiment. The process 600 may be performed by any suitable system such as a modeling subsystem or other component(s) of a data storage service as described above in connection with FIGS. 2-5. The process 600 includes obtaining information corresponding to existing volumes and partitions 602. The information may be maintained by one or more components of the data storage service such as the placement server as described above in connection with FIG. 2. The information may include dimensions of the volumes and partitions thereof, locations of the partitions including a master partition and a slave partition for each partition. In one example, the information includes capacity information for each volume and/or partition consisting of bytes, IOPS, and slots. Each partition including the master partition and slave partition, consumes one or more slots of a data storage server as described above. Furthermore, this information may be broken down or otherwise subdivided into one or more categories such as physical, sellable, consumed, or other logical categories suitable for use in simulating an amount of capacity of the data storage service. For example, a customer purchases a 100 GB volume and writes data to 50 GB, therefore the number of sold bytes equals 100 GB and the number of physical bytes is 50 GB.

Returning to the process 600, the modeling subsystem may then determine a subset of the information of existing volumes and/or partitions to be used to generate the average volume information to be used in the simulations based at least in part on attributes of the existing volumes 604. The attributes of the volumes may include not only the dimensions as described above but additional information associated with the volume such as a hardware type, server type, customer, region, fault zone, data zone, data center, product type, or other information suitable for differentiating volumes for use in the simulations as described above. For example, the modeling system may determine a subset of volumes of a particular product type to determine an average volume for the particular product. This information may enable the modeling subsystem to determine a remaining capacity of the data storage service to implement volumes of the particular product type. In another example, the modeling system may determine a subset of volumes supported by a particular server type (e.g., data storage servers with SSD drives) to determine an average volume for the particular server type.

The modeling subsystem, or other component of the data storage server executing the process 600, may then generate an average volume (e.g., simulated volume and/or partitions thereof) based at least in part on the subset of information of the existing volumes 606. As described above, the modeling subsystem may determine an average partition for one or more dimensions (e.g., bytes, IOPS, and slots). In one example, the modeling subsystem obtains information for a particular partition (e.g., from the subset of information determined above) and adds the particular partition's sold bytes dimensions to a running sum of sold bytes, adds the particular partition's physical bytes to a running sum of physical bytes, and any additional dimensions and categories of dimensions used by the modeling subsystem to generate the average partition. The modeling subsystem may, after summing all of the partition information in the subset of information, divide by the number of partitions summed. This may generate an average for each dimension. As described above, various techniques for determining the average partition may be used in accordance with the present disclosure, such as the median, mode, weighted average, or other statistical methods. In addition, the dimensions may be averaged across categories, for example, the number of physical bytes sold may be averaged with the number of physical bytes utilized by the customer. The average volume, and/or partition may not be representative of a volume or partition the customer may actually purchase or be able to purchase. The average may be a ratio of dimensions of volumes and/or partitions currently supported by the data storage service.

Figure 7:
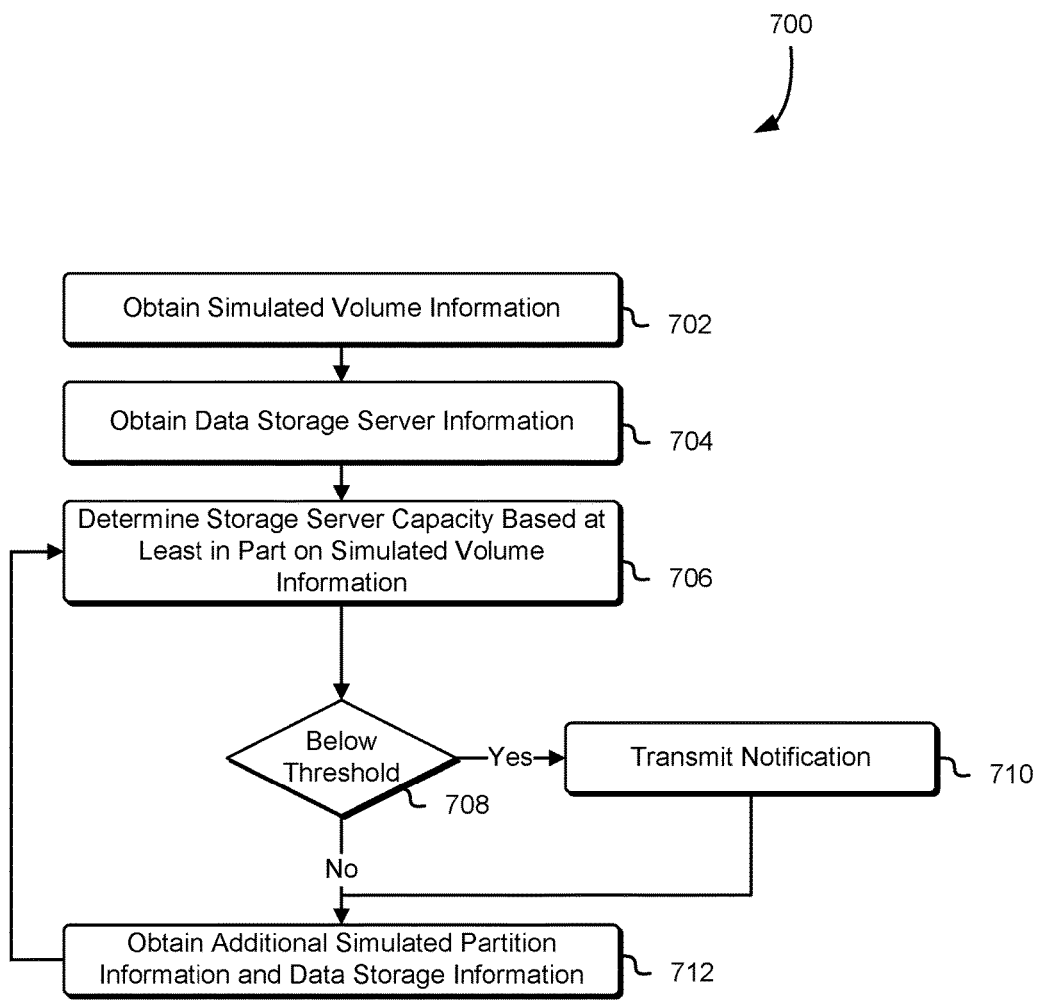
FIG. 7 shows an illustrative process which may be used to determine a remaining storage capacity in accordance with an embodiment.

FIG. 7 is a block diagram illustrating an example of a process 700 for performing a simulation using an average volume and/or partition in accordance with at least one embodiment. The process 700 may be performed by any suitable system such as a modeling subsystem or other component(s) of a data storage service as described above in connection with FIGS. 2-5. The process 700 includes obtaining an average volume information 702. The average volume information may include an average sized partition across various different dimensions and categories of dimensions as described above. The average volume and/or partition may be determined using various methods including the process 600 described above in connection with FIG. 6. The modeling subsystem may then obtain data storage server information 704. For example, the modeling subsystem may obtain capacity information for a set of data storage servers from a placement server as described above in connection with FIG. 2. The capacity information may include a number of bytes, IOPS, and slots both sold and remaining (e.g., unused) of the set of data storage servers.

The modeling subsystem may then determine the storage servers capacity based at least in part on the average volume information 706. The modeling subsystem may simulate placing the average volume and/or partition on the storage servers based at least in part on the data storage server information. For example, the average volume and/or partition for various product types and hardware types are compared to capacity information of various data storage servers for the various dimensions included in the average volume and/or partition and determine a number of average volumes and/or partitions the data storage server may support. The modeling subsystem may then determine in the number of average partitions is below a threshold 708. In addition, the threshold may be determined for one or more dimensions of the average volume. For example, the modeling subsystem may determine in the number of physical bytes is below a threshold after completion of the simulation. If the modeling subsystem determines the threshold is exceeded, the modeling subsystem may transmit a notification 710. The notification may be transmitted to an administrator or other entity of the computing resource service provider, such as a capacity management and planning service. The notification may indicate that the remaining capacity of the data storage service may be insufficient to meet customer demand or may be insufficient at some future point in time.

If the modeling subsystem determines the threshold is not exceeded, the modeling subsystem may obtain additional average partition information and data storage information 712. The additional average partition information and data storage information may be used to execute additional simulations. The additional average partition information and data storage information may be obtained at various intervals and the simulations may be executed at various intervals. For example, the additional average partition information and data storage information and simulations is obtained and executed every 10 minutes. In at least one variation of the process 700, the modeling subsystem determines a metric or score as a result of the simulation. The metric or score may indicate an amount of relative capacity (e.g., relative to the average volume and/or partition) remaining in the data storage service. This information may be provided to other systems or service of the computing resource service provider such as a capacity planning and monitoring service as described above.

Figure 8:
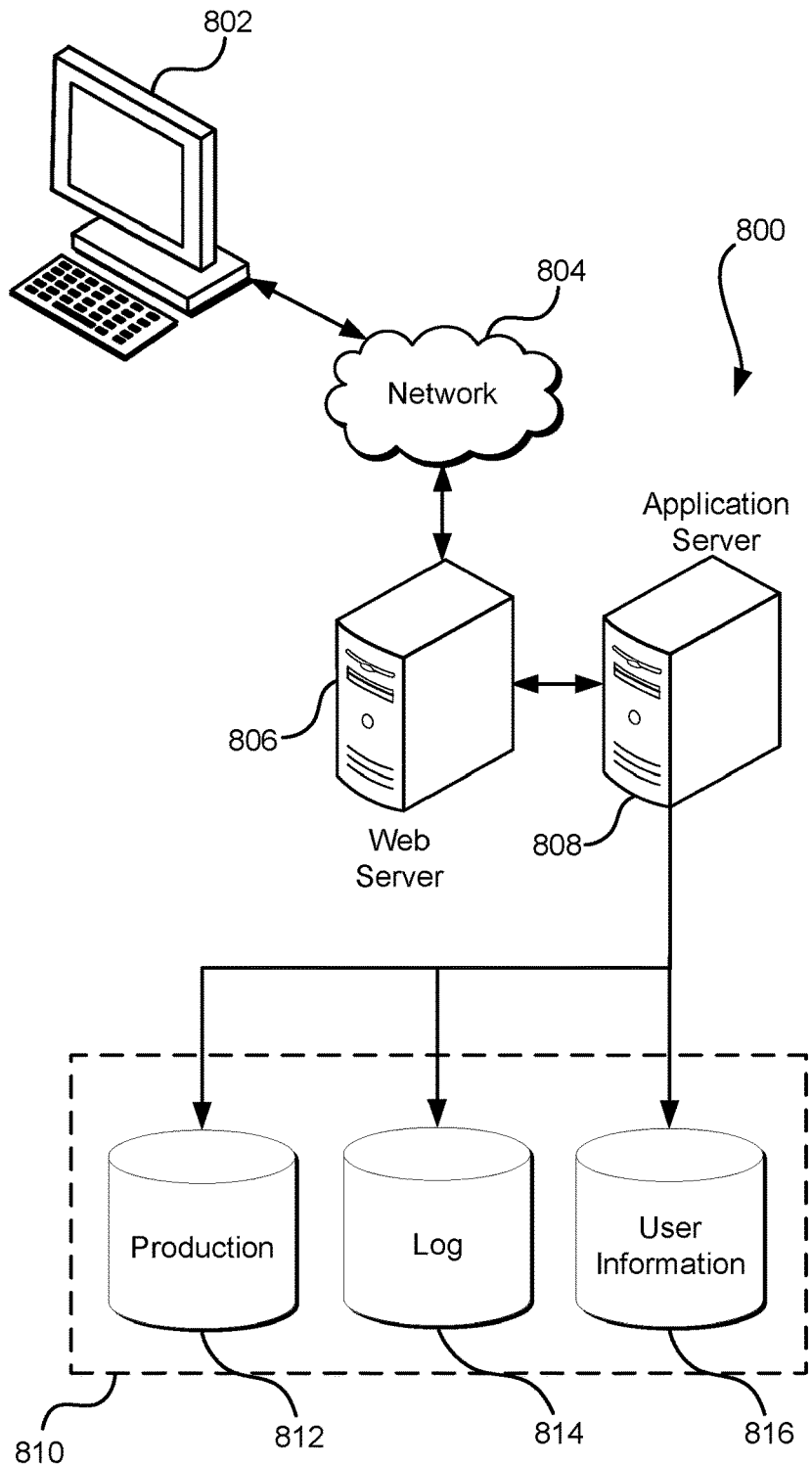
FIG. 8 illustrates an environment in which various embodiments can be implemented.

FIG. 8 illustrates aspects of an example environment 800 for implementing aspects in accordance with various embodiments. As will be appreciated, although a web-based environment is used for purposes of explanation, different environments may be used, as appropriate, to implement various embodiments. The environment includes an electronic client device 802, which can include any appropriate device operable to send and/or receive requests, messages, or information over an appropriate network 804 and, in some embodiments, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other such network and/or combination thereof. Components used for such a system can depend at least in part upon the type of network and/or environment selected. Many protocols and components for communicating via such a network are well known and will not be discussed herein in detail. Communication over the network can be enabled by wired or wireless connections and combinations thereof. In this example, the network includes the Internet and/or other publicly-addressable communications network, as the environment includes a web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS"), JavaScript Object Notation (JSON), and/or another appropriate client-side structured language. Content transferred to a client device may be processed by the client device to provide the content in one or more forms including, but not limited to, forms that are perceptible to the user audibly, visually and/or through other senses. The handling of all requests and responses, as well as the delivery of content between the client device 802 and the application server 808, can be handled by the web server using PHP: Hypertext Preprocessor ("PHP"), Python, Ruby, Perl, Java, HTML, XML, JSON, and/or another appropriate server-side structured language in this example. Further, operations described herein as being performed by a single device may, unless otherwise clear from context, be performed collectively by multiple devices, which may form a distributed and/or virtual system.

The data store 810 can include several separate data tables, databases, data documents, dynamic data storage schemes and/or other data storage mechanisms and media for storing data relating to a particular aspect of the present disclosure. For example, the data store illustrated may include mechanisms for storing production data 812 and user information 816, which can be used to serve content for the production side. The data store also is shown to include a mechanism for storing log data 814, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. The application server 808 may provide static, dynamic, or a combination of static and dynamic data in response to the received instructions. Dynamic data, such as data used in web logs (blogs), shopping applications, news services and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 802. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed (i.e., as a result of being executed) by a processor of the server, allow the server to perform its intended functions.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network, and any combination thereof. In some embodiments, connection-oriented protocols may be used to communicate between network endpoints. Connection-oriented protocols (sometimes called connection-based protocols) are capable of transmitting data in an ordered stream. Connection-oriented protocols can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or web browser. In addition, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. In some embodiments, the code is stored on set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media may comprise multiple non-transitory computer-readable storage media and one or more of individual non-transitory storage media of the multiple non-transitory computer-readable storage media may lack all of the code while the multiple non-transitory computer-readable storage media collectively store all of the code.

Accordingly, in some examples, computer systems are configured to implement one or more services that singly or collectively perform operations of processes described herein. Such computer systems may, for instance, be configured with applicable hardware and/or software that enable the performance of the operations. Further, computer systems that implement various embodiments of the present disclosure may, in some examples, be single devices and, in other examples, be distributed computer systems comprising multiple devices that operate differently such that the distributed computer system performs the operations described herein and such that a single device may not perform all operations.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A system, comprising:
   one or more storage servers provided by a computing service provider environment, the one or more storage servers providing a block-based storage service;
   one or more processors;
   memory with instructions that, when executed by the one or more processors, cause the system to:
      obtain information associated with one or more dimensions of a set of logical volumes maintained by a set of storage servers of the one or more storage servers, the one or more dimensions indicating at least a size and an amount of input/output operations per second (IOPS) associated with a volume of the set of logical volumes;
      determine an average volume based at least in part on the one or more dimensions of the set of logical volumes;
      obtain capacity information of the set of storage servers, the capacity information indicating an amount of computing resources of the set of storage servers consumed or available;

generate a simulation of a remaining capacity of the set of storage servers by at least simulating placing a number of average volumes on the set of storage servers based at least in part on the capacity information of the set of storage servers;

as a result of an expiration of an interval of time, simulate a second remaining capacity of the set of storage servers based at least in part on additional capacity information of the set of storage servers; and provide a notification of the second remaining capacity of the set of storage servers based at least in part on the number of average volumes placed on the set of storage servers during the simulation, wherein the notification indicates a projected time period until there will be insufficient capacity on the set of storage servers; and a capacity management and monitoring service configured to determine, based at least partly on the notification, whether to have additional storage servers installed.

2. The system of claim 1, wherein the one or more dimensions include at least one of the following: a maximum number of bytes, a total number of used byte, a maximum number of IOPS, a total number of used IOPS, and slots.

3. The system of claim 1, wherein memory further includes instructions that, when executed by the one or more processors, cause the system to:

generate a second simulation of a second remaining capacity of the set of storage servers based at least in part on additional information indicating the one or more dimensions of a second set of logical volumes and additional capacity information of the set of storage servers; and determine a rate of change between the remaining capacity and the second remaining capacity by at least determining a ratio between the remaining capacity and the second remaining capacity.

4. The system of claim 3, wherein memory further includes instructions that, when executed by the one or more processors, cause the system to transmit an alarm to a capacity management and monitoring service as a result of the rate of change exceeding a threshold.

5. A system, comprising:
one or more processors; and
memory with instructions that, as a result of being executed by the one or more processors, cause the system to:
obtain one or more dimensions of a set of logical volumes maintained by a set of storage servers of a data storage service provided by a computing service provider environment, the one or more dimensions indicating at least one of a size, an amount of input/output operations per second (IOPS), or a number of slots associated with a volume of the set of logical volumes;
generate one or more simulated volumes based at least in part on the one or more dimensions;
simulate a remaining capacity of the set of storage servers by at least placing a number of the one or more simulated volumes on the set of storage servers based at least in part on a current capacity of the set of storage servers;
as a result of an expiration of an interval of time, simulate a second remaining capacity of the set of storage servers based at least in part on additional capacity information of the set of storage servers;
provide a notification of the remaining capacity of the set of storage servers; and
determine, based at least partly on the notification and the second remaining capacity of the set of storage servers, whether to have additional storage servers installed.

6. The system of claim 5, wherein the instructions that cause the system to obtain the one or more dimensions of the set of logical volumes further include instructions, that as a result of being executed by the one or more processors, cause the system to obtain the one or more dimensions from a subset of the set of logical volumes, the subset of logical volumes having been created during a particular interval of time.

7. The system of claim 5, wherein the memory further includes instructions, that as a result of being executed by the one or more processors, causes the system to provide the remaining capacity to at least one other service.

8. The system of claim 5, wherein the instructions that cause the system to generate the one or more simulated volume further include instructions, that as a result of being executed by the one or more processors, cause the system to, for each dimension of the one or more dimensions, add a particular dimension associated with a particular volume of the one or more volumes to a sum associated with the particular dimensions and divide the sum by a total number of logical volumes summed.

9. The system of claim 5, wherein the set of storage servers further comprises storage servers of a particular logical grouping of storage servers.

10. The system of claim 5, wherein the set of logical volumes further comprises logical volumes of a particular volume type.

11. The system of claim 5, wherein the set of storage servers further comprises storage servers of a particular data zone.

12. The system of claim 5, wherein each logical volume of the set of logical volumes further comprises a master-slave replica pair.

13. A non-transitory computer-readable storage medium having stored thereon executable instructions that, as a result of being executed by one or more processors of a computer system, cause the computer system to at least:
obtain a set of dimensions of a set of logical volumes maintained by a set of storage servers, the set of storage servers, the set of dimensions indicating at least one of a size, an amount of input/output operations per second (IOPS), or a number of slots associated with a volume of the set of logical volumes connected to a network maintained by a computing resource service provider;
obtain capacity and utilization information associated with the set of storage servers;
simulate a remaining capacity of the set of storage servers based at least in part on a simulated volume and the capacity and utilization information, the simulated volume determined based at least in part the set of dimensions;
simulate a second remaining capacity of the set of storage servers based at least in part on a second simulated volume and additional capacity and utilization information; and
determine, based at least partly on the second remaining capacity of the set of storage servers, whether to have additional storage servers installed.

14. The non-transitory computer-readable storage medium of claim 13, wherein the second remaining capacity of the set of storage servers is simulated as a result of an expiration of an interval of time.

15. The non-transitory computer-readable storage medium of claim 14, wherein the instructions further comprise instructions that, as a result of being executed by the one or more processors, cause the computer system to determine a rate of change associated with the set of storage servers based at least in part on the remaining capacity and the second remaining capacity.

16. The non-transitory computer-readable storage medium of claim 15, wherein the instructions further comprise instructions that, as a result of being executed by the one or more processors, cause the computer system to provide a notification to at least on other computer system as a result of the rate of change exceeding a certain value.

17. The non-transitory computer-readable storage medium of claim 15, wherein the instructions further comprise instructions that, as a result of being executed by the one or more processors, cause the computer system to provide a notification to add additional capacity to the set of storage servers as a result of the rate of change exceeding a certain value.

18. The non-transitory computer-readable storage medium of claim 15, wherein the instructions further comprise instructions that, as a result of being executed by the one or more processors, cause the computer system to modifying an application executed by the set of storage servers as a result of the rate of change exceeding a certain value, the application used in providing the set of logical volumes to customers of the computing resource service provider.

19. The non-transitory computer-readable storage medium of claim 13, wherein the instructions further comprise instructions that, as a result of being executed by the one or more processors, cause the computer system to generate the simulated volume by at least calculating a statistical average for at least a portion of the dimensions of the set dimensions, the statistical average of at least one dimension of the portion of the dimensions including two or more dimensions of the set dimensions.

20. The non-transitory computer-readable storage medium of claim 13, wherein the instructions that cause the computer system to obtain the set of dimensions further include instructions that cause the computer system to obtain a number of bytes, a number of IOPS, an amount of throughput, and a latency associated with the set of logical volumes.

* * * * *